(12) United States Patent
Ahn

(10) Patent No.: US 9,842,648 B1
(45) Date of Patent: Dec. 12, 2017

(54) MEMORY APPARATUS AND REFERENCE VOLTAGE SETTING METHOD THEREOF

(71) Applicant: SK hynix Inc., Icheon-si Gyeonggi-do (KR)

(72) Inventor: Chang Yong Ahn, Seoul (KR)

(73) Assignee: SK hynix Inc., Icheon-si, Gyeonggi-do (KR)

( * ) Notice: Subject to any disclaimer, the term of this patent is extended or adjusted under 35 U.S.C. 154(b) by 0 days.

(21) Appl. No.: 15/443,616

(22) Filed: Feb. 27, 2017

(30) Foreign Application Priority Data

Jun. 14, 2016 (KR) ........................ 10-2016-0073722

(51) Int. Cl.
    *G11C 13/00* (2006.01)

(52) U.S. Cl.
    CPC ........ *G11C 13/0069* (2013.01); *G11C 13/004* (2013.01); *G11C 13/0064* (2013.01); *G11C 13/0097* (2013.01); *G11C 13/0004* (2013.01); *G11C 2013/0054* (2013.01)

(58) Field of Classification Search
    CPC .............. G11C 13/0069; G11C 13/004; G11C 13/0054; G11C 13/0064; G11C 13/0097; G11C 13/0004

USPC ............... 365/148, 158, 163, 189.09, 189.16
See application file for complete search history.

(56) References Cited

U.S. PATENT DOCUMENTS

| | | | |
|---|---|---|---|
| 2004/0022115 A1* | 2/2004 | Park ...................... | G11O 5/147 365/226 |
| 2009/0016100 A1* | 1/2009 | Jeong .................. | G11C 11/5678 365/163 |
| 2010/0271861 A1* | 10/2010 | Kitagawa ........... | G11C 13/0009 365/148 |
| 2014/0050022 A1* | 2/2014 | Taylor ................ | G11C 13/0004 365/163 |

FOREIGN PATENT DOCUMENTS

| | | |
|---|---|---|
| KR | 100801082 B1 | 2/2008 |
| KR | 1020150103217 A | 9/2015 |

* cited by examiner

*Primary Examiner* — Tan T. Nguyen
(74) *Attorney, Agent, or Firm* — William Park & Associates Ltd.

(57) ABSTRACT

A memory apparatus includes a write driver, a sense amplifier and a reference voltage setting circuit. The write driver programs a set data or a reset data into a memory cell. The sense amplifier generates an output signal by sensing data stored in the memory cell. The reference voltage setting circuit sets a set reference voltage having a lowest level to satisfy a set data distribution, and sets a set-up reset reference voltage from the set reference voltage.

20 Claims, 9 Drawing Sheets

MEMORY APPARATUS AND REFERENCE VOLTAGE SETTING METHOD THEREOF

CROSS-REFERENCES TO RELATED APPLICATION

The present application claims priority under 35 U.S.C. §119(a) to Korean application number 10-2016-0073722, filed on Jun. 14, 2016 in the Korean Intellectual Property Office, which is incorporated herein by reference in its entirety as set forth in full.

BACKGROUND

1. Technical Field

Various embodiments relate to a semiconductor apparatus, and more particularly, to a memory apparatus and a reference voltage setting method thereof.

2. Related Art

A dynamic random access memory (DRAM) includes a memory cell comprising a capacitor, and stores data by electrically charging and discharging the memory cell. However, the capacitor naturally discharges through a leakage current and thus the DRAM is volatile memory. Research has been done for a non-volatile memory that does not have to perform refresh operations in order to maintain stored data. Particularly, implementation of non-volatility through a change of material forming the memory cell has been tried. An example is a memory apparatus having a resistive memory cell. The memory apparatus includes a phase-change memory apparatus and resistance memory apparatus.

The resistive memory apparatus includes a memory cell formed with a material of variable resistance, where the resistance of the material varies according to an amount of current running through the material. Therefore, intended data may be stored in the memory cell of the resistive memory apparatus by adjusting the amount of current applied to the memory cell. For example, the memory cell of the resistive memory apparatus may be set in a low-resistive state to store set data, and may be set as in a high-resistive state to store a reset data.

The resistive memory apparatus may perform program and verification operations to exactly store the intended data. For example, the resistive memory apparatus may program the intended data into the memory cell. And then, the resistive memory apparatus may perform a verification-read operation in order to verify that the memory cell precisely stored the intended data. When the memory cell stores the intended data precisely, the program operation may end. When the memory cell does not precisely store the intended data, the program operation and the verification-read operation may be repeated. As described above, the intended data may be stored in the memory cell by repeating the program and verification-read operations. However, repetition of the program and verification-read operations may adversely affect the endurance of the memory cell.

SUMMARY

In an embodiment of the present disclosure, a memory apparatus may include: a write driver configured to program a set data or a reset data into a memory cell; a sense amplifier configured to generate an output signal by sensing a data stored in the memory cell; and a reference voltage setting circuit configured to set a set reference voltage by providing the sense amplifier with a variable reference voltage based on the output signal, and to set a set-up reset reference voltage which has a higher level than the set reference voltage by a predetermined amount.

In an embodiment of the present disclosure, a memory apparatus may include: a write driver configured to program a set data or a reset data into a memory cell; a data sensing circuit configured to generate a plurality of output signals by comparing data stored in the memory cell with a plurality of reference voltages; and a reference voltage setting circuit configured to set a set reference voltage having a lowest level that satisfies a set data distribution based on the plurality of output signals, and to set a set-up reset reference voltage which has a higher level than the set reference voltage by a predetermined amount.

DETAILED DESCRIPTION

Hereinafter, a semiconductor apparatus according to the present disclosure will be described below with reference to the accompanying drawings through exemplary embodiments.

Figure 1:
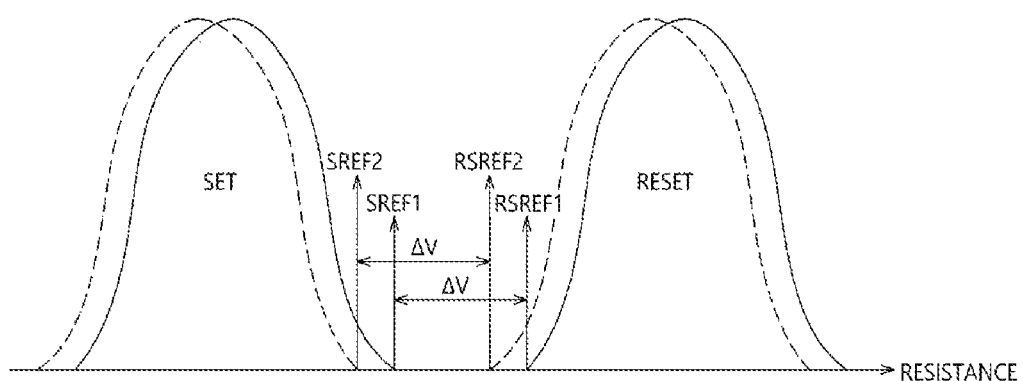
FIG. 1 is a resistance distribution of data stored in a memory apparatus in accordance with an embodiment.

FIG. 1 is a resistance distribution of data stored in a memory apparatus in accordance with an exemplary embodiment of the present disclosure. Referring to FIG. 1, the memory apparatus may store set data SET and reset data RESET. The set data SET may correspond to a low resistance value and the reset data RESET may correspond to a relatively higher resistance value. Referring to a resistance distribution represented by a solid line in FIG. 1, the resistance distribution of the set data SET may be sensed according to a first set reference voltage SREF1. That is, the first set reference voltage SREF1 may satisfy a set distribution. A first reset reference voltage RSREF1 for sensing the reset data RESET may be set to have a higher level than the first set reference voltage SREF1 by a predetermined amount. The predetermined amount may be a least sensing margin ($\Delta V$) between the set data SET and the reset data RESET, where the least sensing margin may be for sensing the set data SET and the reset data RESET. Referring to a resistance distribution represented by a dotted line in FIG. 1, it may be seen that a resistance distribution of the set data SET is located in a lower resistance region than that of the resistance distribution of the set data SET represented by the solid line. Therefore, it may be enough to set a second set reference voltage SREF2 for sensing the set data SET of the resistance distribution represented by the dotted line to have lower level that that of the first set reference voltage SREF1. Accordingly, a second reset reference voltage RSREF2 for sensing the reset data RESET of the resistance distribution represented by the dotted line may be also set to have lower level than that of the first reset reference voltage RSREF1. The resistance distribution of the set data SET and the reset data RESET may vary for each memory cell according to characteristics of the memory cell. However, in the case of the resistance distribution represented by the dotted line, a problem may occur with the endurance of a memory cell when the reset reference voltage is set to have a high level although the reset reference voltage is set to have a lower level according to characteristics of the memory cell. For example, when programming a reset data RESET into a memory cell, a strong current may be applied to the memory cell to program the memory cell to have the resistance distribution satisfying the first reset reference voltage RSREF1. Therefore, it is important to lower a level of the reset reference voltage according to characteristics of the memory cell for the endurance and reliability of the memory apparatus.

Figure 2:
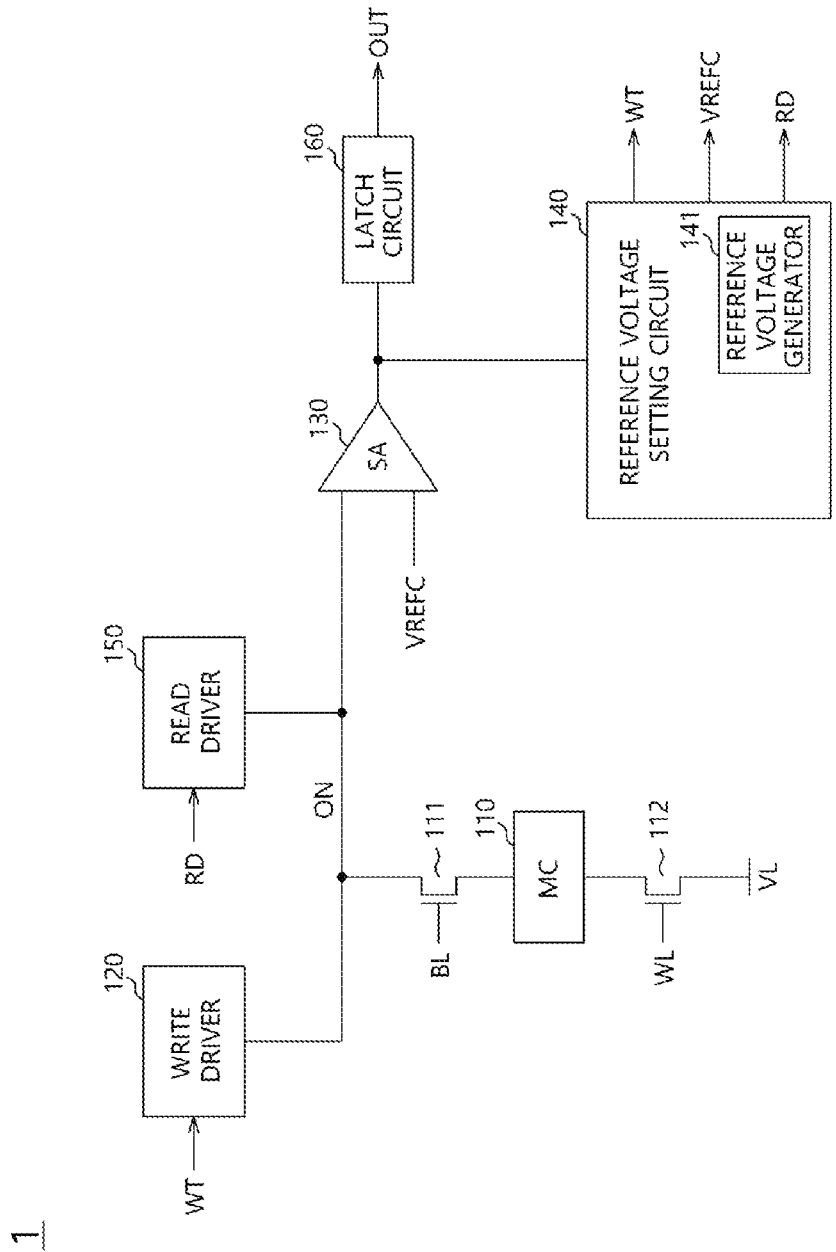
FIG. 2 is a block diagram illustrating a memory apparatus in accordance with an embodiment.

FIG. 2 is a block diagram illustrating a memory apparatus 1 in accordance with an exemplary embodiment of the present disclosure. Referring to FIG. 2, the memory apparatus 1 may include a memory cell 110, a write driver 120, a sense amplifier 130, and a reference voltage setting circuit 140. The memory cell 110 may store data according to phase change or resistance value change. The memory cell 110 may be formed of a phase-change material or a variable resistance material, and may store different data according to an intensity of current applied to the memory cell 110. For example, the memory cell 110 may store set data in a low resistance state and reset data in a high resistance state. The memory apparatus 1 may be a resistive memory apparatus suitable for storing data according to a change in the resistance value of the memory cell 110, and, for example, may include a phase-change memory or a resistance memory. A particular bit line may be selected according to a bit line selection signal BL, and a particular word line may be selected according to a word line selection signal WL. When a particular bit line is selected, the memory cell 110 may be coupled to an operation node ON through a column switch 111. When a particular word line is selected, the memory cell 110 may be coupled to a low voltage node VL through a row switch 112. A low voltage may be supplied to the memory cell 110 through the low voltage node VL, and may be a ground voltage or a bulk bias voltage.

The write driver 120 may program set data or reset data into the memory cell 110. The write driver 120 may provide the memory cell 110 with a write current for programming the set data into the memory cell 110, and a different write current for programming the reset data into the memory cell 110. The write current for programming the set data and the write current for programming the reset data may have different amplitudes and pulse widths from each other. The write driver 120 may provide the memory cell 110 with write currents in response to a write signal WT. In other words, the write driver 120 may provide the memory cell 110 with a write current corresponding to the set data or the reset data in response to the write signal WT.

The sense amplifier 130 may generate an output signal OUT by comparing data stored in the memory cell 110 with a variable reference voltage VREFC. The sense amplifier 130 may generate the output signal OUT by amplifying a difference between the variable reference voltage VREFC provided from the reference voltage setting circuit 140 and a voltage level of the operation node ON. The voltage level of the operation node ON may depend on the data stored in the memory cell 110. Referring to FIG. 2, the memory apparatus 1 may further include a read driver 150. The read driver 150 may provide the memory cell 110 with a read current in response to a read signal RD. When the read driver 150 provides the memory cell 110 with the read current, the voltage level of the operation node ON may change according to the resistance value of the memory cell 110. For example, the voltage level of the operation node ON may be relatively low when the memory cell 110 stores a set data, and the voltage level of the operation node ON may be relatively high when the memory cell 110 stores a reset data. The memory apparatus 1 may further include a latch circuit 160. The latch circuit 160 may latch and output the output signal OUT. The latch circuit 160 may be coupled to a data input/output circuit included in the memory apparatus 1.

The reference voltage setting circuit 140 may set a set reference voltage and a reset reference voltage. The reference voltage setting circuit 140 may set the set reference voltage to have a lowest voltage level capable of sensing a set data. The reference voltage setting circuit 140 may also set the reset reference voltage to have a lowest voltage level to sense a reset data. The reference voltage setting circuit 140 may provide the sense amplifier 130 with the variable reference voltage VREFC to set the set reference voltage and the reset reference voltage. The reference voltage setting circuit 140 may receive the output signal OUT. The reference voltage setting circuit 140 may change the level of the variable reference voltage VREFC based on the output signal OUT. For example, the reference voltage setting circuit 140 may increase the level of the variable reference voltage VREFC in stages from an initial level. The initial level may be sufficiently low. When a set data is stored in the memory cell 110, the reference voltage setting circuit 140 may monitor the output signal OUT while providing the variable reference voltage VREFC which may be gradually increased from the initial level. When the reference voltage setting circuit 140 increases the level of the variable reference voltage VREFC, the sense amplifier 130 may generate the output signal OUT by comparing the increased variable reference voltage VREFC with the voltage level of the operation node ON. This process may be repeated. The reference voltage setting circuit 140 may increase the level of the variable reference voltage VREFC until the output signal OUT has a value corresponding to the set data. The reference voltage setting circuit 140 may set the increased variable reference voltage VREFC as the set reference voltage when the output signal OUT has a value corresponding to the set data and thus the variable reference voltage VREFC satisfies the set data distribution.

The reference voltage setting circuit 140 may set a set-up reset reference voltage based on the set reference voltage. The reference voltage setting circuit 140 may set the set-up reset reference voltage to have a higher level than the set reference voltage by a predetermined amount. The predetermined amount may be arbitrarily set. The predetermined amount may correspond to a least sensing margin that is enough to sense the set data and the reset data. For example, the predetermined amount may be a least sensing margin, which is enough to discriminate a distribution of the set data and the reset data, where the least sensing margin may be obtained through experiment or experience. The predetermined amount may be set according to information of one part per million, and, for example, may be set to correspond to a margin below several parts per million. The part per million may represent a likelihood that correct sensing cannot be performed due to unclear discrimination between the set data and the reset data. For example, the part per million may be obtained through a repair operation or a test operation to a memory apparatus.

Upon completion of setting the set reference voltage and the set-up reset reference voltage, the reference voltage setting circuit 140 may control the write driver 120 to store the reset data into the memory cell 110. The reference voltage setting circuit 140 may provide the sense amplifier 130 with the variable reference voltage VREFC having the level of the set-up reset reference voltage at a lowest level. The reference voltage setting circuit 140 may increase the level of the variable reference voltage VREFC from the level of the set-up reset reference voltage until the output signal OUT has a value corresponding to the reset data. When the output signal OUT has a value corresponding to the reset data, that is, when the variable reference voltage VREFC satisfies a reset distribution, the reference voltage setting circuit 140 may set the variable reference voltage VREFC as the reset reference voltage.

The reference voltage setting circuit 140 may be implemented using a programmable state machine. The reference voltage setting circuit 140 may generate the write signal WT, the read signal RD, and the variable reference voltage VREFC based on the output signal OUT. The reference voltage setting circuit 140 may include a reference voltage generator 141 to generate the variable reference voltage VREFC.

Figure 3:
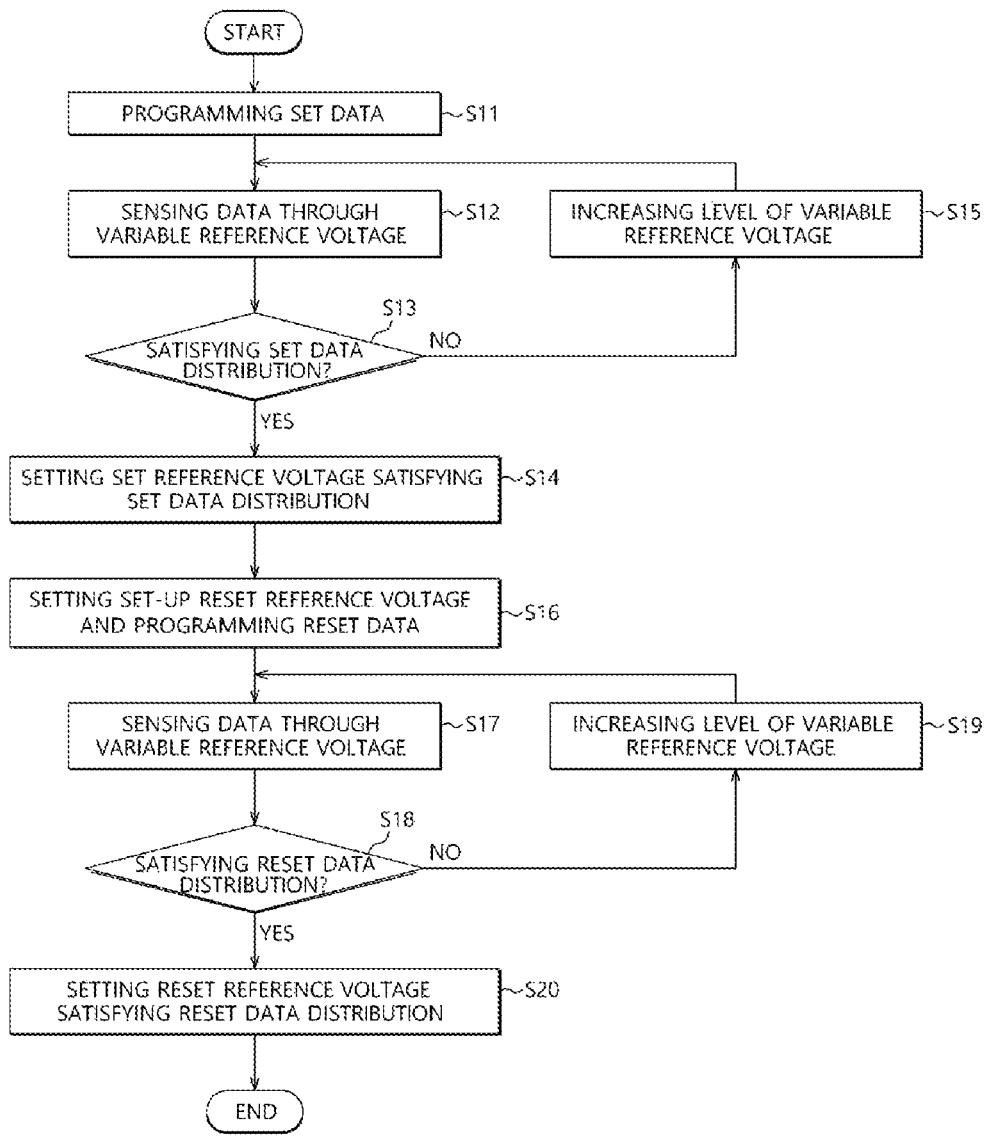
FIG. 3 is a flowchart illustrating an operation of a memory apparatus in accordance with an embodiment.

FIG. 3 is a flowchart illustrating an operation of the memory apparatus 1 in accordance with an exemplary embodiment of the present disclosure. Hereinafter, described with reference to FIGS. 2 and 3 will be the operation of the memory apparatus 1 and a method of setting the reference voltage in accordance with an exemplary embodiment of the present disclosure. The reference voltage setting circuit 140 may provide the write signal WT to control the write driver 120 to store a set data into the memory cell 110. The write driver 120 may program the set data into the memory cell 110 by providing a write current to the memory cell 110 (S11). Upon completion of programming the set data, the reference voltage setting circuit 140 may provide the sense amplifier 130 with the variable reference voltage VREFC having an initial level, and may provide the read signal RD to the read driver 150. The read driver 150 may provide a read current to the memory cell 110, and the sense amplifier 130 may generate the output signal OUT by comparing the voltage level of the operation node ON and the level of the variable reference voltage VREFC and by amplifying the difference between the voltage level of the operation node ON and the level of the variable reference voltage VREFC (S12). As a result of sensing data stored in the memory cell 110 by the variable reference voltage VREFC, when the output signal OUT has a value corresponding to the set data, that is, when the output signal OUT satisfies the set distribution, the reference voltage setting circuit 140 may set the variable reference voltage VREFC as the set reference voltage (S13 and S14). On the other hand, when the output signal OUT does not satisfy the set distribution, the reference voltage setting circuit 140 may increase the level of the variable reference voltage VREFC (S13 and S15). The sense amplifier 130 may then sense the data stored in the memory cell 110 using the level-increased variable reference voltage VREFC (S12). The steps S12 and S15 may be repeated until the output signal OUT satisfies the set distribution. When the output signal OUT satisfies the set distribution, the reference voltage setting circuit 140 may set the level-increased variable reference voltage VREFC as the set reference voltage (S13 and S14). Further, the reference voltage setting circuit 140 may set a set-up reset reference voltage to have a higher level than the set reference voltage by a predetermined amount (S16).

The reference voltage setting circuit 140 may also control the write driver 120 to program the reset data into the memory cell 110. The reference voltage setting circuit 140 may provide the write signal WT to the write driver 120 in order to program reset data into the memory cell 110. The write driver 120 may program the reset data into the memory cell 110 by providing a write current to the memory cell 110 (S16). Upon completion of programming the reset data into the memory cell 110, the reference voltage setting circuit 140 may provide the read signal RD to the read driver 150, and may provide the sense amplifier 130 with a variable reference voltage VREFC having a level corresponding to the set-up reset reference voltage. The sense amplifier 130 may then generate the output signal OUT by sensing the data stored in the memory cell 110 using the variable reference voltage VREFC (S17). The sense amplifier 130 may generate the output signal OUT by comparing the voltage level of the operation node ON according to the data stored in the memory cell 110 with the level of the variable reference voltage VREFC and by amplifying the difference between the voltage level of the operation node ON and the level of the variable reference voltage VREFC.

When the output signal OUT has a value corresponding to the reset data, that is, when the output signal OUT satisfies the reset distribution (S18), the reference voltage setting circuit 140 may set the variable reference voltage VREFC as the reset reference voltage (S20). When the output signal OUT does not satisfy the reset distribution (S18), the reference voltage setting circuit 140 may increase the level of the variable reference voltage VREFC (S19). The sense amplifier 130 may generate the output signal OUT again by comparing the voltage level of the operation node ON and the level of the level-increased variable reference voltage VREFC (S17). The steps S17 and S19 may be repeated until the output signal OUT satisfies the reset distribution. When the output signal OUT satisfies the reset distribution, the reference voltage setting circuit 140 may set the level-increased variable reference voltage VREFC as the reset reference voltage (S20). The method of setting the reference voltage in accordance with an exemplary embodiment of the present disclosure may be separately performed on each memory cell or each memory cell group. Accordingly, it is possible to set various set reference voltages and reset reference voltages for respective memory cells or respective memory cell groups according to characteristics of a memory cell, which improves the sensing margin of the memory apparatus and the endurance of the memory cell.

Figure 4:
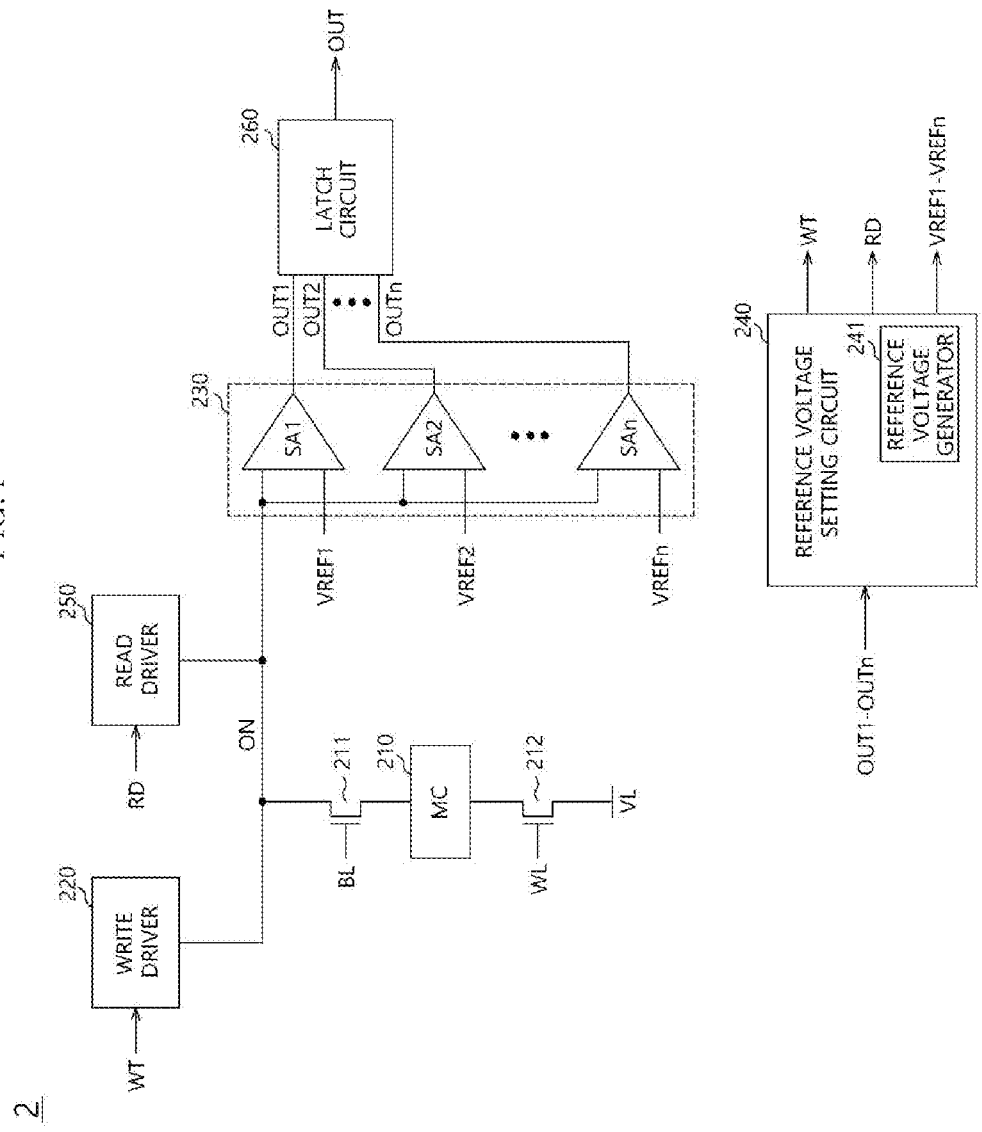
FIG. 4 is a block diagram illustrating a memory apparatus in accordance with an embodiment.

FIG. 4 is a block diagram illustrating a memory apparatus 2 in accordance with an exemplary embodiment of the present disclosure. The memory apparatus 2 may include a memory cell 210, a write driver 220, a data sensing circuit 230, and a reference voltage setting circuit 240. A particular bit line may be selected when a bit line selection signal BL is enabled, and a particular word line may be selected when a word line selection signal WL is enabled. When a particular bit line is selected, the memory cell 210 may be coupled to an operation node circuit or operation node ON through a column switch 211. When a particular word line is selected, the memory cell 210 may be coupled to a low voltage node VL through a row switch 212. The write driver 220 may program a set data or a reset data into the memory cell 210 by providing the memory cell 210 with a write current in response to a write signal WT.

The data sensing circuit 230 may generate a plurality of output signals OUT1 to OUTn by comparing data stored in the memory cell 210 with a plurality of reference voltages VREF1 to VREFn. The data sensing circuit 230 may be coupled to the memory cell 210 through the operation node ON. The memory apparatus 2 may further include a read driver 250. The read driver 250 may provide the memory cell 210 with a read current in response to a read signal RD. The read driver 250 may change a voltage level of the operation node ON according to a resistance value of data stored in the memory cell 210. The data sensing circuit 230 may compare a voltage level of the operation node ON with each of the plurality of reference voltages VREF1 to VREFn and amplify the difference between the voltage level of the operation node ON and each of the plurality of reference voltages VREF1 to VREFn.

The data sensing circuit 230 may include a plurality of sense amplifiers SA1 to SAn. For example, the data sensing circuit 230 may include first to n^th sense amplifiers SA1 to SAn. The first sense amplifier SA1 may generate the first output signal OUT1 by comparing the voltage level of the operation node ON with the first reference voltage VREF1 and amplifying a difference between the voltage level of the operation node ON and the first reference voltage VREF1. The second sense amplifier SA2 may generate the second output signal OUT2 by comparing the voltage level of the operation node ON with the second reference voltage VREF2 and amplifying a difference between the voltage level of the operation node ON and the second reference voltage VREF2. The n^th sense amplifier SAn may generate the n^th output signal OUTn by comparing the voltage level of the operation node ON with the n^th reference voltage VREFn and amplifying a difference between the voltage level of the operation node ON and the n^th reference voltage VREFn.

The reference voltage setting circuit 240 may set a set reference voltage and a reset reference voltage. The reference voltage setting circuit 240 may set the set reference voltage to have a lowest level to satisfy the set data distribution. The reference voltage setting circuit 240 may set the reset reference voltage to have a lowest level to satisfy the reset data distribution. The reference voltage setting circuit 240 may provide the write driver 220 with the write signal WT so that the write driver 220 programs a set data into the memory cell 210 for setting the set reference voltage. The reference voltage setting circuit 240 may provide the data sensing circuit 230 with the plurality of reference voltages VREF1 to VREFn to set the set reference voltage. The plurality of reference voltages VREF1 to VREFn may have different levels from one another, and may have gradually increasing voltage levels from an initial voltage level. The reference voltage setting circuit 240 may set the set reference voltage having a lowest level to satisfy the set data distribution based on the plurality of output signals OUT1 to OUTn. The reference voltage setting circuit 240 may provide the plurality of reference voltages VREF1 to VREFn simultaneously, i.e. the plurality of reference voltages VREF1 to VREFn may be provided at the same time. The data sensing circuit 230 sense amplifiers SA1 to SAn may generate the plurality of output signals OUT1 to OUTn by comparing the data stored in the memory cell 210 simultaneously with each of the plurality of reference voltages VREF1 to VREFn. Therefore, unlike the reference voltage setting circuit 140 described with reference to FIG. 2, it is possible to rapidly set the set reference voltage without repeating data sensing while increasing the level of the reference voltage. Upon completion of setting the set reference voltage, the reference voltage setting circuit 240 may set a set-up reset reference voltage to have a higher level than that of the set reference voltage by a predetermined amount. Upon completion of setting the set-up reset reference voltage, the reference voltage setting circuit 240 may provide the write driver 220 with the write signal WT so that the write driver 220 programs the reset data into the memory cell 210. The reference voltage setting circuit 240 may provide the data sensing circuit 230 with the plurality of reference voltages VREF1 to VREFn, which have the level of the set-up reset reference voltage as a lowest level and have gradually increasing levels from the lowest level. The reference voltage setting circuit 240 may set the reset reference voltage having a lowest level to satisfy the reset data distribution based on the plurality of output signals OUT1 to OUTn.

The reference voltage setting circuit 240 may provide the write driver 220 with the write signal WT so that the write driver 220 provides the memory cell 210 with a write current for programming set data or reset data. The reference voltage setting circuit 240 may provide the read driver 250 with the read signal RD for the sensing operation of the data sensing circuit 230. The reference voltage setting circuit 240 may be implemented using a programmable state machine. The reference voltage setting circuit 240 may include a reference voltage generator 241 to generate the plurality of reference voltages VREF1 to VREFn.

Referring to FIG. 4, the memory apparatus 2 may further include a latch circuit 260. The latch circuit 260 may generate an output signal OUT by latching one among the plurality of output signals OUT1 to OUTn provided from the data sensing circuit 230. In an embodiment, upon completion of setting the set reference voltage and the reset reference voltage, the reference voltage setting circuit 240 may activate one and deactivate the others among the plurality of sense amplifiers SA1 to SAn for a normal operation. In an embodiment, the reference voltage setting circuit 240 may control the latch circuit 260 to latch one among the plurality of output signals OUT1 to OUTn for a normal operation.

Figure 5:
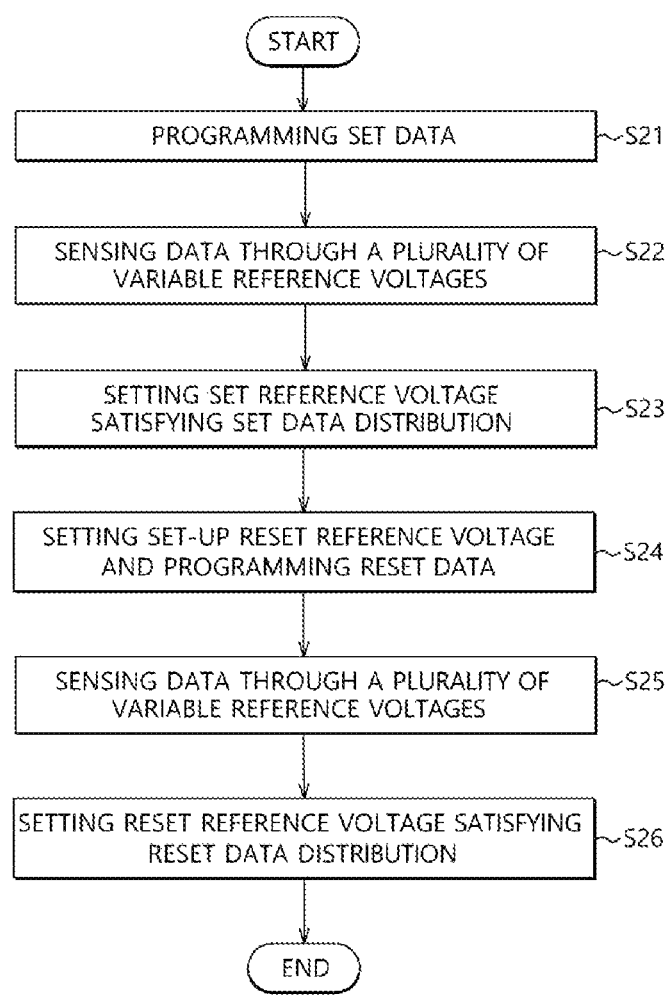
FIG. 5 is a flowchart illustrating an operation of a memory apparatus in accordance with an embodiment.

FIG. 5 is a flowchart illustrating an operation of the memory apparatus 2 in accordance with an exemplary embodiment of the present disclosure. Hereinafter, described with reference to FIGS. 4 and 5 will be the operation of the memory apparatus 2 and a method of setting the reference voltage in accordance with an exemplary embodiment of the present disclosure. The reference voltage setting circuit 240 may control the write driver 220 to program a set data into the memory cell 110 for setting the set reference voltage (S21). The reference voltage setting circuit 240 may provide the plurality of reference voltages VREF1 to VREFn to the data sensing circuit 230, and may provide the read signal RD to the read driver 250. The read driver 250 may provide a read current to the memory cell 210, and the voltage level of the operation node ON may change according to the resistance value of the memory cell 210. The data sensing circuit 230 may generate the plurality of output signals OUT1 to OUTn by comparing the voltage level of the operation node ON with each of the plurality of reference voltages VREF1 to VREFn and by amplifying a difference between the voltage level of the operation node ON and each of the plurality of reference voltages VREF1 to VREFn (S22). The reference voltage setting circuit 240 may set the set reference voltage to a lowest level among the reference voltages satisfying the set data distribution based on the plurality of output signals OUT1 to OUTn (S23). Upon completion of setting the set reference voltage, the reference voltage setting circuit 240 may set a set-up reset reference voltage to have a higher level than that of the set reference voltage by a predetermined amount (S24).

The reference voltage setting circuit 240 may control the write driver 220 to program the reset data into the memory cell 210 (S24). The reference voltage setting circuit 240 may provide the plurality of reference voltages VREF1 to VREFn, which have the level of the set-up reset reference voltage as a lowest level and have gradually increased levels from the lowest level, to the data sensing circuit 230, and may provide the read signal RD to the read driver 250. The data sensing circuit 230 may generate the plurality of output signals OUT1 to OUTn by comparing the voltage level of the operation node ON with each of the plurality of reference voltages VREF1 to VREFn and by amplifying a difference between the voltage level of the operation node ON and each of the plurality of reference voltages VREF1 to VREFn (S25). The reference voltage setting circuit 240 may set as the reset reference voltage a reference voltage having a lowest level among the reference voltages satisfying the reset data distribution based on the plurality of output signals OUT1 to OUTn (S26).

Figure 6:
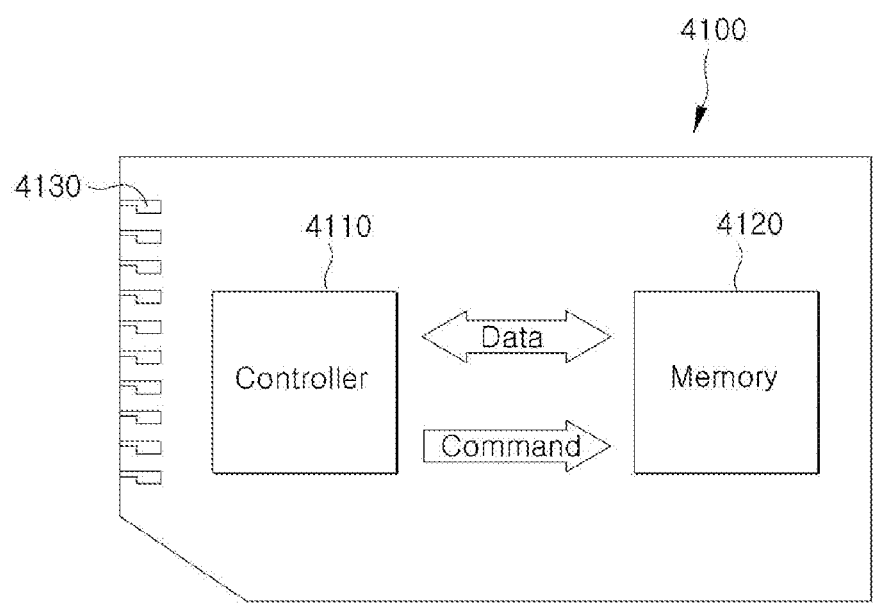
FIG. 6 is a schematic diagram illustrating a memory card including a memory apparatus in accordance with various embodiments.

FIG. 6 is a schematic diagram illustrating a memory card system 4100 including a memory apparatus in accordance with various exemplary embodiments of the present disclosure. Referring to FIG. 6, the memory card system 4100 may include a controller 4110, a memory 4120, and an interface member 4130. The controller 4110 and the memory 4120 may be configured to exchange a command and/or data. For example, the memory 4120 may be used to store a command, which is executed by the controller 4110, and/or user data.

The memory card system 4100 may store data into the memory 4120 or output data to an external device from the memory 4120. The memory 4120 may include the memory apparatuses 1 and 2 in accordance with various exemplary embodiments of the present disclosure.

The interface member 4130 may be configured to transfer data from/to an external device. The memory card system 4100 may be a multimedia card (MMC), a secure digital card (SD), or a portable data storage device.

Figure 7:
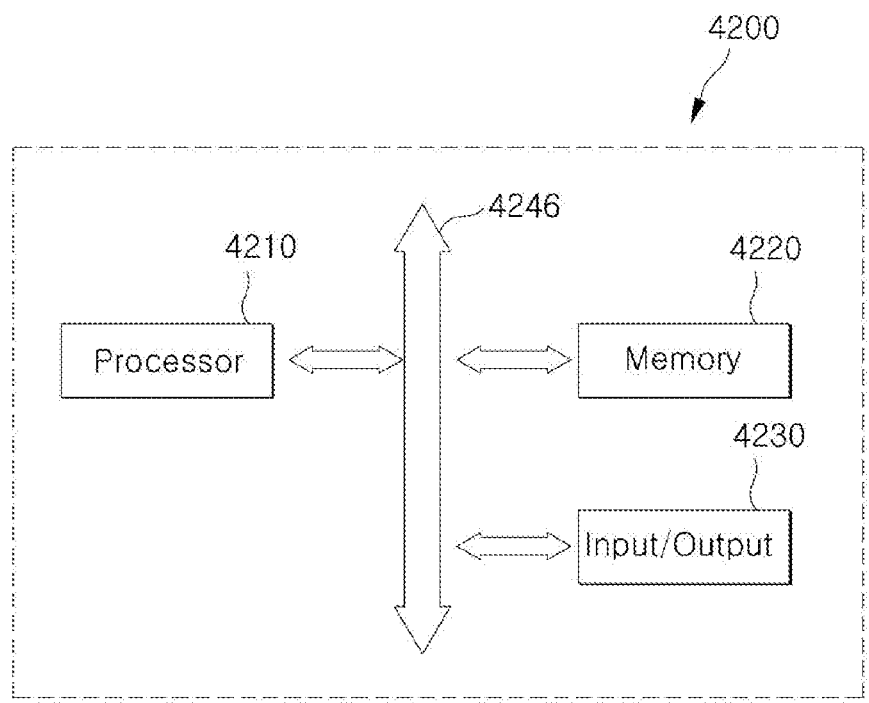
FIG. 7 is a block diagram illustrating an electronic device including a memory apparatus in accordance with various embodiments.

FIG. 7 is a block diagram illustrating an electronic device 4200 including a memory apparatus in accordance with various exemplary embodiments of the present disclosure. Referring to FIG. 7, the electronic device 4200 may include a processor 4210, a memory 4220, and an input/output device 4230. The processor 4210, the memory 4220 and the input/output device 4230 may be coupled to one another through a bus 4246.

The memory 4220 may receive a control signal from the processor 4210. The memory 4220 may be used to store code and data for the operation of the processor 4210. The memory 4220 may be used to store data, which is accessed through the bus 4246. The memory 4220 may include the memory apparatuses 1 and 2 in accordance with various exemplary embodiments of the present disclosure. Additional circuits and control signals may be provided for implementations and modifications of the present disclosure.

The electronic device 4200 may be included in various electronic control devices requiring the memory 4220. For example, the electronic device 4200 may be used in a personal digital assistant (PDA), a laptop computer, a portable computer, a web tablet, a wireless phone, a portable phone, a digital music player, a MP3 player, a navigation, a solid state disk (SSD), a household appliance, or any device capable of wireless communication.

Described with reference to FIGS. 8 and 9 will be detailed examples of the implementations and modifications of the electronic device 4200.

Figure 8:
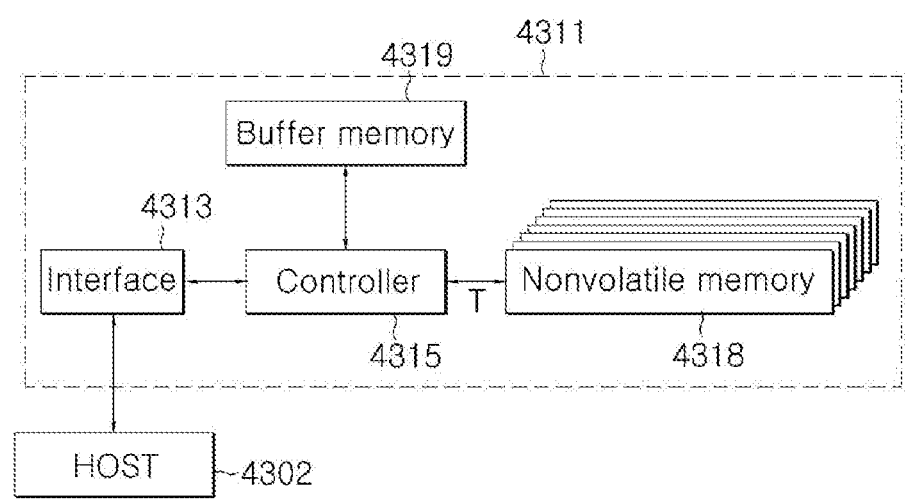
FIG. 8 is a block diagram illustrating a data storage device including a memory apparatus in accordance with various embodiments.

FIG. 8 is a block diagram illustrating a data storage device including a memory apparatus in accordance with various exemplary embodiments of the present disclosure. Referring to FIG. 8, a data storage device may be provided such as the solid state disk (SSD) 4311. The SSD 4311 may include an interface 4313, a controller 4315, a nonvolatile memory 4318, and a buffer memory 4319.

The SSD 4311 stores data through a semiconductor apparatus. The SSD 4311 has an advantage over a hard disk drive (HDD) since the SSD 4311 operates faster and is friendly to miniaturization and weight-lightening while having low mechanical delay or failure rate, low heating, and low noise. The SSD 4311 may be widely used in a notebook PC, a netbook, a desktop PC, a MP3 player, or a portable storage device.

The controller 4315 may be disposed near the interface 4313 and may be electrically coupled to the interface 4313. The controller 4315 may be a microprocessor including a memory controller and a buffer controller. The nonvolatile memory 4318 may be disposed near the controller 4315 and may be electrically coupled to the controller 4315 through a connection terminal T. Data storage capacity of the SSD 4311 may correspond to that of the nonvolatile memory 4318. The buffer memory 4319 may be disposed near the controller 4315 and may be electrically coupled to the controller 4315.

The interface 4313 may be coupled to a host 4302 and configured to transfer an electrical signal such as data. For example, the interface 4313 may conform to a protocol such as SATA, IDE, SCSI, and/or combination thereof. The nonvolatile memory 4318 may be coupled to the interface 4313 through the controller 4315.

The nonvolatile memory 4318 may store data provided through the interface 4313. The nonvolatile memory 4318 may include the memory apparatuses 1 and 2 in accordance with various exemplary embodiments of the present disclosure. The nonvolatile memory 4318 may maintain stored data even when power supply to the SSD 4311 is cut off.

The buffer memory 4319 may include a volatile memory. The volatile memory may be DRAM and/or SRAM. The buffer memory 4319 may operate faster than the nonvolatile memory 4318.

The interface 4313 may process data faster than the nonvolatile memory 4318. The buffer memory 4319 may temporarily store data. Data provided through the interface 4313 may be temporarily stored in the buffer memory 4319 via the controller 4315, and may be stored in the nonvolatile memory 4318 at the data storage speed of the nonvolatile memory 4318.

Among data stored in the nonvolatile memory 4318, frequently accessed data may be read in advance from the nonvolatile memory 4318 and temporarily stored in the buffer memory 4319. That is, the buffer memory 4319 may serve to increase effective operation speed of the SSD 4311 and reduce error rate of the SSD 4311.

Figure 9:
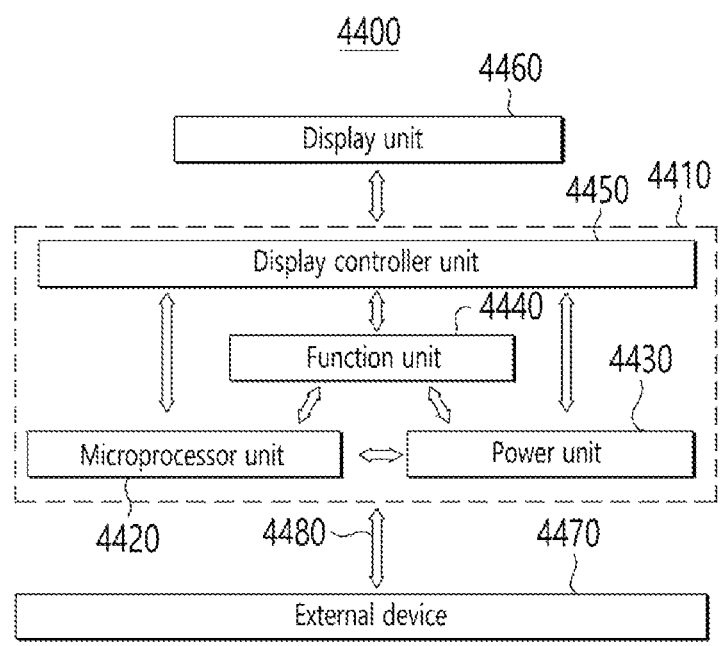
FIG. 9 is a block diagram illustrating an electronic system including a memory apparatus in accordance with various embodiments.

FIG. 9 is a block diagram illustrating an electronic system 4400 including a memory apparatus in accordance with various exemplary embodiments of the present disclosure. Referring to FIG. 9, the electronic system 4400 may include a body 4410, a microprocessor unit 4420, a power unit 4430, a function unit 4440, and a display controller unit 4450.

The body 4410 may be a motherboard formed with the printed circuit board (PCB). The microprocessor unit 4420, the power unit 4430, the function unit 4440, and the display controller unit 4450 may be mounted on the body 4410. A display unit 4460 may be disposed in or outside the body 4410. For example, the display unit 4460 may be disposed on a surface of the body 4410 and display images processed by the display controller unit 4450.

The power unit 4430 may receive a predetermined voltage from an external battery, divide the provided voltage into required voltages of various levels, and provide the divided voltages to the microprocessor unit 4420, the function unit 4440, the display controller unit 4450 and so forth. The microprocessor unit 4420 may receive the divided voltage from the power unit 4430 and may control the function unit 4440 and the display unit 4460. The function unit 4440 may perform various functions of the electronic system 4400. For example, if the electronic system 4400 is a cellular phone, the function unit 4440 may include various elements capable of cellular phone functions such as dialling, image output to the display unit 4460, and voice output to a speaker through communication with an external device 4470 and so forth, and may function as a camera image processor when a camera is mounted in the electronic system 4400.

If the electronic system 4400 is coupled to a memory card for storage capacity expansion, the function unit 4440 may be a memory card controller. The function unit 4440 may exchange signals with the external device 4470 through a wired or wireless communication unit 4480. If the electronic system 4400 requires a device such as a universal serial bus (USB) storage device for function expansion, the function unit 4440 may work as an interface controller. The memory apparatuses 1 and 2 in accordance with various exemplary embodiments of the present disclosure may be applied to one or more of the microprocessor unit 4420 and the function unit 4440.

While certain embodiments have been described above, it will be understood to those skilled in the art that the embodiments described are by way of example only. Accordingly, the memory apparatus and reference voltage setting method thereof should not be limited based on the described embodiments. Rather, the memory apparatus and reference voltage setting method thereof described herein should only be limited in light of the claims that follow when taken in conjunction with the above description and accompanying drawings.

What is claimed is:

1. A memory apparatus comprising:
    a write driver configured to program a set data or a reset data into a memory cell;
    a sense amplifier configured to sense data stored in the memory cell to generate an output signal; and
    a reference voltage setting circuit configured to set a set reference voltage by providing the sense amplifier with a variable reference voltage based on the output signal, and to set a set-up reset reference voltage which has a higher level than the set reference voltage by a predetermined amount.

2. The memory apparatus of claim 1, wherein the write driver provide the memory cell with a write current corresponding to the set data or the reset data based on a write signal.

3. The memory apparatus of claim 1, wherein the sense amplifier generates the output signal by comparing the data stored in the memory cell with the variable reference voltage provided from the reference voltage setting circuit.

4. The memory apparatus of claim 1, wherein the reference voltage setting circuit controls the write driver to store the set data into the memory cell, and sets the set reference voltage having a lowest level capable of sensing the set data.

5. The memory apparatus of claim 4, wherein the reference voltage setting circuit increases a level of the variable reference voltage until the output signal has a value corresponding to the set data, and sets the increased variable reference voltage as the set reference voltage when the output signal has the value corresponding to the set data.

6. The memory apparatus of claim 5, wherein, upon completion of setting the set reference voltage, the reference voltage setting circuit controls the write driver to store the reset data into the memory cell.

7. The memory apparatus of claim 6, wherein the reference voltage setting circuit sets a reset reference voltage having a lowest level capable of sensing the reset data.

8. The memory apparatus of claim 6, wherein the reference voltage setting circuit increases the level of the variable reference voltage from a level of the set-up reset reference voltage until the output signal has a value corresponding to the reset data, and sets the increased variable reference voltage as the reset reference voltage when the output signal has the value corresponding to the reset data.

9. The memory apparatus of claim 1, wherein the predetermined amount is determined on a basis of a least sensing margin for sensing the set data and the reset data.

10. The memory apparatus of claim 1, further comprising a read driver configured to provide the memory cell with a read current based on a read signal.

11. A memory apparatus comprising:
    a write driver configured to program a set data or a reset data into a memory cell;
    a data sensing circuit configured to generate a plurality of output signals by comparing data stored in the memory cell with a plurality of reference voltages; and
    a reference voltage setting circuit configured to set a set reference voltage having a lowest level that satisfies a set data distribution based on the plurality of output signals, and to set a set-up reset reference voltage which has a higher level than the set reference voltage by a predetermined amount.

12. The memory apparatus of claim 11, wherein the write driver provide the memory cell with a write current corresponding to the set data or the reset data based on a write signal.

13. The memory apparatus of claim 11, wherein the data sensing circuit includes a plurality of sense amplifiers configured to generate the plurality of output signals by comparing the data stored in the memory cell with each of the plurality of reference voltages.

14. The memory apparatus of claim 11, wherein the predetermined amount is determined on a basis of a least sensing margin for sensing the set data and the reset data.

15. The memory apparatus of claim 11, wherein the reference voltage setting circuit provides a write signal to the write driver to program the set data into the memory cell.

16. The memory apparatus of claim 15, wherein, upon completion of setting the set reference voltage, the reference voltage setting circuit provides the write signal to the write driver to program the reset data into the memory cell.

17. The memory apparatus of claim 16, wherein the reference voltage setting circuit sets a reset reference voltage having a lowest level to satisfy a reset data distribution based on the plurality of output signals.

18. The memory apparatus of claim 16, wherein the reference voltage setting circuit provides the data sensing circuit with the plurality of reference voltages having a level of the set-up reset reference voltage as a lowest level, and sets the reset reference voltage based on the plurality of output signals.

19. The memory apparatus of claim 18, wherein the reference voltage setting circuit provides the data sensing circuit with the plurality of reference voltages at the same time.

20. The memory apparatus of claim 18, wherein each of the plurality of reference voltages has an increasing voltage level.

* * * * *